(12) United States Patent
Mueller et al.

(10) Patent No.: US 6,316,786 B1
(45) Date of Patent: *Nov. 13, 2001

(54) ORGANIC OPTO-ELECTRONIC DEVICES

(75) Inventors: Peter Mueller, Zurich; Heike E. Riel, Rueschlikon; Walter Riess, Adliswil, all of (CH); Horst Vestweber, Winterscheid (DE)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/368,153

(22) Filed: Aug. 4, 1999

(30) Foreign Application Priority Data

Aug. 29, 1998 (EP) .................................. 98116408

(51) Int. Cl.⁷ ........................... H01L 35/24; H01L 51/00; H01L 23/48; H01L 23/52; H01L 29/40
(52) U.S. Cl. ........................ 257/40; 257/686; 257/778; 428/690
(58) Field of Search ............................ 257/40, 685, 686; 257/778; 428/690

(56) References Cited

U.S. PATENT DOCUMENTS

| | | | |
|---|---|---|---|
| 5,340,619 | 8/1994 | Chen et al. | 424/498 |
| 5,504,035 | * 4/1996 | Rostoker et al. | 228/180.22 |
| 5,633,535 | * 5/1997 | Chao et al. | 257/778 |
| 5,886,474 | * 3/1999 | Asai et al. | 315/169.1 |

FOREIGN PATENT DOCUMENTS

WO 98/07202  2/1998 (WO).
WO 99/31741  6/1999 (WO).

OTHER PUBLICATIONS

M. Pope, H.P. Kallmann & P. Magnate; Journal Chem. Phys., vol. 38, 1963, pp. 2042–2043; "Electroluminescence in Organic Crystals."No month givern.

Helfrich and Schneider; Physical Review Letters, vol. 14, No. 7, Feb., 1965, pp. 229–231;"Recombination Radiation in Anthreacene Crystals."

C.W. Tang et al., "Organic Electroluminescent diodes", Applied Physics Letters, vol. 51, No. 12, Sep., 1987, pp. 913–915.

Burroughes et al., Nature, vol. 347, Oct., 1990, pp. 539–541, "Light–emitting diodes based on conjugated polymers."

Grenham et al., Nature, vol. 365, Oct., 1993, pp. 628–630, "Efficient light–emitting diodes based on polymers with high electron affinities."

C. Hosokawa and T. Kusumoto, International Symposium on Inorganic and Organic Electroluminscence, Oct., 1994, Hamamatsu, pp. 42–47, "Blue Electroluminescence from Multilayer Devices with Distyrylarylene."

(List continued on next page.)

*Primary Examiner*—Eddie C. Lee
*Assistant Examiner*—Allan R. Wilson
(74) *Attorney, Agent, or Firm*—Marian Underweiser

(57) ABSTRACT

The present invention pertains to new flip-chip organic opto-electronic structures and methods for making the same. The new organic opto-electronic device includes at least two separate parts. Each part comprises an electrode and at least one of these electrodes carries an organic stack. After completion of these separate parts both are brought together to form the complete opto-electronic device. It is a crucial aspect of the new flip-chip approach that spacers are integrated on one or both sides of the parts and that an interface formation process is employed.

24 Claims, 3 Drawing Sheets

OTHER PUBLICATIONS

T. Wakimoto et al., International Symposium on Inorganic and Organic Electroluminescence, Oct., 1994, Hamamatsu, pp. 77–79, "Organic EL Cells with High Luminous Efficiency".

C. Tang, Proceedings of SID '96 San Diego, CA, USA, May 12–17, 1996; SID '96 Digest, pp. 181–184 Invited paper, "An Overview of Organic Electroluminescent Materials and Devices."

E. Staring et al, International Symposium on Inorganic and Organic Electroluminescence,Oct., 1994, Hamamatsu, pp. 48–53, "Polymer LED's: Materials and Devices".

C. Adachi et al., Appl.Physics Letters, vol. 66, No. 20, May, 1995, pp. 2679–2681, "Molecular Design of Hole Transport Materials for Obtaining High Durability in Organic Electroluminescent Diodes."

Y. Shirota et al.,Appl. Physics Letters, vol. 65, No. 7, Aug., 1994, pp. 807–809, "Multilayered Organic Electroluminescent Device Using a Novel Starburst Molecule, 4, 4, 4–tris (3–methylphenylphenylamino)triphenylamine, as a hole transport material."

Y. Kuwabara et al., Adv. Mater., 6, No. 9, pp. 677–679; 1994, H "Thermally Stable Multilayered Organic Electroluminescent Devices Using Novel Starburst Molecules, 4, 4, 4–Tri(N–carbazolyl)triphenylamine(TCTA) and 4, 4, 4 – Tris (3–methylphenylphenylamino)triphenylamino (m–MT-DATA), as Hole–Transport Materials."No month given.

* cited by examiner

ORGANIC OPTO-ELECTRONIC DEVICES

BACKGROUND OF THE INVENTION

1. Field of the Invention

The present invention concerns new organic opto-electronic devices, such as organic light emitting diodes (OLEDs), organic displays, organic solar cells, photodiodes and the like. Also addressed is a new method for making such devices.

2. Discussion of the Related Art

Organic light emitting diodes (OLEDs) are an emerging technology with potential applications as discrete light emitting devices, or as the active elements of light emitting arrays, such as flat-panel displays. OLEDs are devices in which a stack of organic layers is sandwiched between two electrodes. At least one of these electrodes must be transparent in order for light —which is generated in the active region of the organic stack—to escape. To achieve high efficiency and low voltage operation each of the organic layers as well as the electrodes have to be optimized for their individual function; charge carrier injection, charge carrier transport, charge carrier recombination, and light extraction. Despite the great progress achieved in recent years, full optimization is difficult to obtain using conventional approaches, as will be outlined below.

OLEDs emit light which is generated by injection electroluminescence (EL). Organic EL at low efficiency was observed many years ago in metal/organic/metal structures as, for example, reported in Pope et al., Journal Chem. Phys., Vol. 38, 1963, pp. 2024, and in "Recombination Radiation in Anthracene Crystals", Helfrich et al., Physical Review Letters, Vol. 14, No. 7, 1965, pp. 229–231. Recent developments have been spurred largely by two reports of high efficiency organic EL. These are C. W. Tang et al., "Organic electroluminescent diodes", Applied Physics Letters, Vol. 51, No. 12, 1987, pp. 913–915, and by a group from Cambridge University in Burroughes et al., Nature, Vol. 347, 1990, pp. 539. Tang used vacuum deposition of molecular compounds to form OLEDs with two organic layers. Burroughes spin coated a polymer, poly(p-phenylenevinylene), to form a single-organic-layer OLED. The advances described by Tang and in subsequent work by N. Greenham et al., Nature, Vol. 365, 1993, pp. 628–630, were achieved mainly through improvements in OLED design derived from the selection of appropriate organic multilayers and electrode metals.

To date, virtually all OLED device structures have been built on glass substrates coated with indium-tin oxide (ITO), which serves as a transparent anode, i.e. light is emitted through the anode and substrate. This kind of a device structure is usually referred to as cathode-up structure. The cathode is typically a low-workfunction elemental metal or low-workfunction alloy, e.g. Ca, Al, Mg/Ag, or Al/Li. Such cathodes are opaque. These low-workfunction elemental metals and alloys belong to the first class of cathode materials considered for OLEDs.

In order to enable a variety of possible applications, OLED structures suitable for opaque substrates (i.e. substrates other than the conventional glass substrates) are highly desirable. For example, if OLEDs could be fabricated on silicon, this would permit the use of an integrated active-matrix drive scheme. In such a structure light must be emitted through the uppermost layers of the device rather than through the substrate. One possible solution would be to build OLEDs by depositing the layers in the opposite order, which means a structure would be obtained with the transparent ITO anode deposited on top (referred to as anode-up structure). This has proved difficult, presumably due to the harsh conditions under which the ITO is deposited.

Alternatively, devices could be fabricated with the normal sequence of layers provided that a transparent cathode could be found. Gallium Nitride (GaN) has already been suggested as one possible cathode material for these kind of alternative cathode-up structures, as disclosed and described in an international patent application WO98/07202 with title "Gallium Nitride Based Cathodes for Organic Electroluminescent Devices and Displays". The international publication date of this patent application is Feb. 19, 1998. The GaN is a non-degenerate, wide-bandgap semiconductor (nd-WBS). As described in the international application, all nd-WBSs have the advantage that their wide bandgap makes them transparent. It has been shown that the wide bandgap also leads to a favorable alignment of either the conduction band or valance band with the lowest unoccupied molecular orbitals (LUMO) or highest occupied molecular orbital (HOMO) of the organic material into which charge is to be injected. These non-degenerate, wide-bandgap semiconductors form a second class of cathode materials considered for OLEDs.

It has been shown that improved performance can be achieved when the electrode materials are chosen to match the respective molecular orbitals of the organic material into which it is supposed to inject carriers. By choosing the optimized electrode materials the energy barriers to injection of carriers can be reduced.

It has been shown in U.S. Pat. No. 5,340,619, with title "Method of manufacturing a color filter array", that ink-jet printing or other printing technologies can be used to coat a substrate. First, the substrate is coated with a blue resin which is baked (cured) before red and green colored polyimide dyes are each added and cured respectively. After all the colors are added and cured, laser ablation is used to reduce the thickness of the coating to develop a color filter array.

With multilayer device architectures now well understood and commonly used, the major performance limitation of OLEDs is the lack of ideal contact electrodes, and in particular the lack of transparent and conducting materials which can be deposited on organic layers without causing damage having a detrimental effect on the device performance and reliability.

One figure of merit for electrode materials is the position of the energy levels (bands) relative to those of the organic materials. In some applications it is also desirable for the electrode material to be transparent, as mentioned above. Furthermore, the electrode should be chemically inert and capable of forming a dense uniform film to effectively encapsulate the OLED. It is also desirable that the electrode and/or electrode deposition does not lead to a strong quenching of EL.

Another important figure of merit for electrode materials is the ease of handling and problem-free deposition on organic layers. Futhermore, the electrode materials have to be compatible with the organic materials underneath which is often difficult to achieve.

The incompatibility problems inherent to most electrode materials used so far can be extended and generalized. The most severe limitations in the deposition of metals and semiconductor-based electrodes onto organic layers are:
damage of the organic materials during the deposition which often leads to irreversible changes within the organic layers and at their interfaces;

damage of the organic materials due to heat treatments required to obtain electrodes with good physical, mechanical and electrical and electro-optical properties. High process temperatures lead to thermal damage of the organic materials such as crystallization, interdiffusion and intermixing of the organics.

low manufacturing yield because the more processing steps are performed, the lower the output of fully functional devices gets.

reduced number of materials available, because not-only electrical, but also chemical compatibility with the organic materials is required. For example, up to now no polymers can be deposited on top of evaporated organic layers, because of dissolving problems.

So far, there is a costly and time-consuming search for better suited materials which may serve as stable, possibly transparent electrodes.

SUMMARY OF THE INVENTION

It is therefore an object of the present invention to provide a new and improved approach which allows to overcome some or all of the above-mentioned problems and disadvantages.

It is an object of the present invention to provide new and improved organic opto-electronic devices such as organic light emitting devices, arrays and displays as well as solar cells and photodiodes.

It is another object of the present invention to provide a method for the formation of new and improved organic opto-electronic devices such as organic light emitting devices, arrays and displays as well as solar cells and photodiodes.

The above objects have been accomplished by providing new flip-chip organic opto-electronic structures and methods for making the same. According to the present invention, the opto-electronic device includes at least of two separate parts. Each part comprises an electrode and at least one of these electrodes carries an organic stack. After completion of these separate parts both are brought together forming the complete opto-electronic device. The interface between the two flip-chip parts can be stabilized by applying a special interface formation procedure.

It is a crucial aspect of the new flip-chip approach that spacers are integrated on one or both sides of the parts. These spacers have to meet the following criteria to ensure proper operation of an organic opto-electronic structure:

the size and shape of the spacers have to be such that sufficient electrical contact is provided between the organic layers on the different pieces or the organic layer and the electrode on the different parts.

the spacers must prevent short circuits. This means that the spacers consist either of non conducting materials or if they are conducting they should be electrical isolated at least from one electrode structure.

the spacers have to be rigid, to protect the organic layers from damage. This is especially important for flexible device structures.

the total thickness of the spacers have to be chosen in such a way, that sufficient electrical contact between the organic layers is provided and damage between the organic layers is avoided.

The inventive flip-chip approach allows to split off the device fabrication process and therefore separates the respective incompatible process steps. Both fabrication processes can thus be separately and independently optimized.

It is an advantage of the present flip-chip approach that both the organic structure and the electrode structure can be tested and inspected before putting them together.

The inventive approach capitalizes primarily on the inventor's finding that a contact of sufficiently high quality can be obtained between the electrode structure and the organic structure if the spacers are designed appropriately. It furthermore is based on the conclusion derived from experiments, that an organic opto-electronic device in fact can be put together using two separate and discrete parts, namely an organic structure and a complementary electrode structure. It can even be more general, in that a structure is put together from two separate parts which both consist of an electrode structure and parts of the active layers. The approach to fabricate an organic device in two separate parts is unique because experts currently working on organic devices are in particular concerned about the quality of the interfaces between adjacent layers. Until now it seemed to be inconceivable—if not even completely out of the question—to 'take' an organic device apart. Should the interface quality of a flip-chip device according to the present invention not be acceptable, one might employ a special heat treatment. Experiments showed that the quality of the interface formation can be adjusted or tailored by applying such a special heat treatment.

The inventive approach further capitalizes on the inventor's finding that the interface between the two flip-chip parts can be stabilized, or optimized, or tailored by applying a special interface formation procedure.

The results of the experiments are very surprising in particular if one considers them in the light of the existing prejudice.

It is also important to consider, that the inventive approach is completely foreign to conventional semiconductor technology where an electrode or metalization always is formed right on the semiconducting layers to ensure intimate contact.

Other advantages will become obvious form the detailed description and the drawings.

In one embodiment of the present invention a first substrate carries electrodes only, whereas the second substrate carries an electrode together with the complete organic stack of one or more organic opto-electronic devices.

In another embodiment, the first substrate carries electrodes and part of the organic layers. The second substrate also carries some of the organic layers and another electrode.

In yet another embodiment, the present flip-chip approach is used to make an organic light emitting array, such as a display for example.

Employing a flip-chip technology in accordance with the present invention adds flexibility in the choice of electrode designs.

Some further advantages of the inventive approach are:

electrodes can be deposited at conditions otherwise not suited for OLED formation (e.g. high temperature, aggressive chemical environment, ion damage (sputter damage), high energy particle processes);

electrodes can be easily patterened;

separate testing and inspection of both 'halfs' is possible. This helps to increase the yield and thus reduces manufacturing costs.

each 'half' can be made of optimized materials and using optimized processes without having to take care of incompatibility issues.

If appropriately designed, the spacers also serve as studs or posts which protect the sensitive parts from being mechanically damaged during handling, as will be discussed in connection with FIGS. 1A and 1B.

The present approach is well suited for the formation of large area displays, for example, where the yield is one of the major cost factors. The larger an active matrix display gets, the more likely it is that one transistor fails. In such a case the whole display is not suited for use and has to be discarded. The present approach leads to a drastically increased yield which in turn allows to make cheaper display.

The spacers can provide conductive connection between circuitry on the two halves. This is especially important for large area displays where the conductivity of the common electrode limits the device performance.

Additional spacers can be employed that provide a conductive connection between circuitry on the two 'halfs'.

BRIEF DESCRIPTION OF THE DRAWINGS

The invention is described in detail below with reference to the following schematic drawings.

DETAILED DESCRIPTION OF THE PREFERRED EMBODIMENTS

In order to fabricate an ideal organic opto-electronic device (such as an OLED) based on optimized materials and characterized by an enhanced device performance and stability, we propose a novel fabrication process, herein referred to as flip-chip process. In contrast to a commonly used device fabrication process, where the individual layers (e.g. an anode, organic stack, and a cathode) are deposited subsequently on a substrate, the flip-chip process splits off the device fabrication process onto different substrates and therefore separates the crucial fabrication processes. As addressed in the introductory portion, these processes often are the deposition process of the electrodes and electrode modifications. In order to avoid damage of the device structure during alignment and fabrication, and to ensure appropriate operation of the device, spacers are integrated on at least one substrate.

Figure 1A:
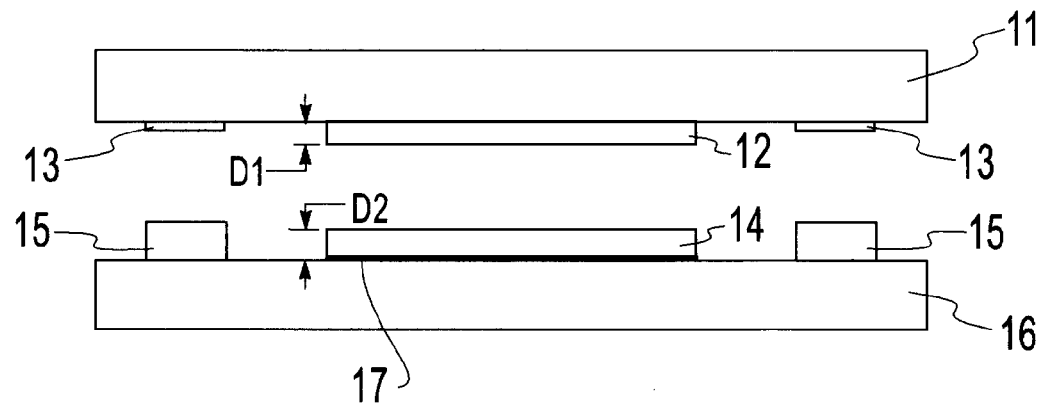
FIG. 1A is a schematic cross section of a first substrate carrying an electrode (referred to as electrode structure) and a second substrate carrying an organic light emitting stack with a common electrode (referred to as organic structure), according to the present invention.
Figure 1B:
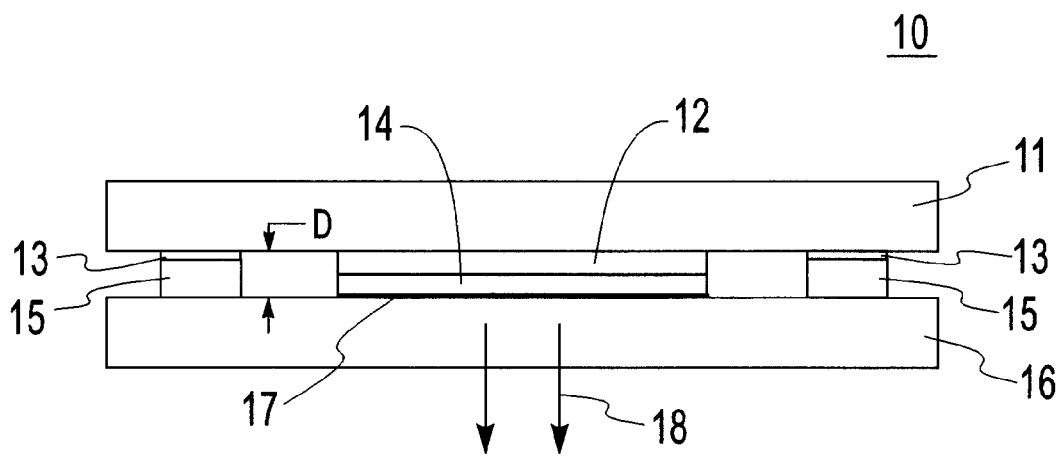
FIG. 1B is a schematic cross section of a flip-chip organic light emitting structure, according to the present invention, after the electrode structure and the organic structure have been flipped together.

Turning now to FIGS. 1A and 1B, a first embodiment of the present invention is described. This first embodiment comprises a first substrate 11 carrying an electrode 12 and two spacer halves 13. The first substrate 11 together with the electrode 12 are herein referred to as electrode structure. Corresponding spacer halves 15 are formed on a second substrate 16. This second substrate 16 also comprises an organic stack 14 (herein referred to as organic structure) and a common electrode 17. Such an organic stack at least comprises a light emitting layer where light is generated if an appropriate voltage is applied across the electrodes. The flip-chip organic light emitting device 10 is shown in assembled form in FIG. 1B. The two substrates 11 and 16 are flipped together such that an intimate contact is provided between the electrode 12 and the organic stack 14. The spacer halves 13 and 15 set the distance (D) between the two substrates 11 and 16. Furthermore, these spacers precisely define the forces (pressure and stress) acting upon the electrode 12 and the organic stack 14.

The substrate 16 may be a glass substrate for example. Any other transparent substrate can be chosen as well. The organic stack 14 comprises a transparent electrode 17. Well suited as transparent electrode 17 is ITO, which then acts as anode. The thickness of the anode 17 is chosen to provide as high a conductance as possible. Well suited is a thickness of 100 nm or more. In the present embodiment the anode 17 is 100 nm thick. Right on top of the anode 17 there is at least one organic layer in which electroluminescence takes place if an appropriate voltage is applied. Such an organic layer is usually referred to as organic emission layer (EML).

A cathode 12 is formed on the substrate 11. In the present embodiment silicon serves as substrate 11. As cathode material a low work function metal or alloy, for example Mg/Ag, is used. The thickness of the cathode 12 is chosen to provide a high conductance. Well suited is a thickness of 100 nm or more. In the present embodiment the Mg/Ag cathode 12 is 500nm thick.

Exemplary details of the first embodiment are given in the following table.

| Layer | No. | Material | Width | present example |
|---|---|---|---|---|
| substrate | 16 | glass | 0.05 mm–5 mm | 2 mm |
| anode | 17 | ITO | 10–2000 nm | 100 nm |
| EL | 14 | Alq3 | 10–2000 nm | 80 nm |
| cathode | 12 | Mg/Ag | 10–1000 nm | 500 nm |
| substrate | 11 | silicon | 0.1 mm–5 mm | 1 mm |

Please note that the first embodiment is a cathode-up structure where light 18 is emitted through the anode 17 and substrate 16 into the half-space below the device 10, as indicated in FIG. 1B.

The spacers 13 and 15 comprise silicon nitride, $SiN_x$, $SiO_x$, $SiO_2$, Siliconoxynitride (SiON), organic compounds such as polyimides, aluminiumoxide, aluminiumnitride, or titaniumoxide, for example. The combined thickness (D) of the two spacer halves has to be slightly less than the thickness D1 of the organic stack 14 and anode 17 and the thickness D2 of the electrode structure 12 together. As a rule of thumb, D has to be between 80% and 100% of D1+D2. Preferably, the thickness D is between 90% and 98% of D1+D2. Please note that in the present embodiment the spacer halves 15 are thicker than the organic stack 14 and anode 17. This has the advantage that the stack 14 is protected from being mechanically damaged while handling the substrate 16. The thickness of the spacers depends on the morphological properties of the organic stack 14 and electrode 12 and can be adapted to achieve the best results. It is important that the spacers are non-conducting to prevent shorts. If needed, special spacers can be added that provide for a conductive connection between circuitry of the organic structure and circuitry on the electrode structure. The spacers can be large (wide and long) if space permits. In OLED display applications, however, instead of large spacers smaller spacers are preferred. Every pixel of a display might be protected by a very small spacer. Thus, extremely robust, large area and high resolution displays can be fabricated with the inventive flip-chip approach.

For a proper function of a device according to the present invention, the quality of interface between the two flip-chip parts, is of crucial importance. It has been demonstrated by the inventors that the interface between the two flip-chip parts can be stabilized, optimized and tailored by applying a special interface formation procedure. This procedure can consist of a simple heating process, or an exposure to intense light, or an UV curing process, or a combination of any of these methods. Common to all these procedures is that they lead in combination with the present spacers to a homogeneous and uniform interface formation. A further advantage of the described interface formation process is, that it can be applied to any type of organic/organic, organic/inorganic, and inorganic/inorganic interfaces.

A few examples of the special interface formation procedure are given in the following. In the case of polymeric systems the application of UV light can lead to crosslinking between polymers of the two parts of the flip-chip device. In the case of a heat treatment (polymers, small molecule systems) the interface is warmed up for some time. The actual heating time as well as the temperature depends on parameters like the chemical structure of the material supposed to form an interface, and the desired depth of the interface formation process (e.g. is the interface formation supposed to be limited the immediate neighborghood of the two flip-chip parts, or is the interface formation supposed to extend into the two flip-chip parts). The heating time can vary from much less than a second up to several hours and more. The interface formation temperature is also system dependent. In the case of organic and/or amorphous materials it should not exceed the glass transition temperature of the most sensitive layer of the flip-chip structure for a long time. For stable glass forming systems, however, it can even be higher.

The spacers, according to the present invention, allow for the application of a pressure between the two flip-chip parts without running the risk to damage the device. One might even apply an external force to increase the pressure between the two flip-chip parts. The pressure also has an impact on the interface formation process.

The present interface formation process allows to form a chemically, morphologically, mechanically and electrically stable interface.

In order to improve the interface formation process, one might apply one or several special layers on the respective surfaces of the two flip-chip parts such that a reaction can take place or can be initiated when combining the two halves.

Due to the fact that the spacers define the distance D between the first and second substrates, also flexible substrates can be employed. This allows to realize flexible organic light emitting displays and solar cells where the operation of the individual OLEDs or the individual cells of the solar cell are not influenced when bending the whole device because the spacers provide small independent cells inside the device. The geometry of these cells remains almost unchanged when bending the inventive device.

Figure 3A:
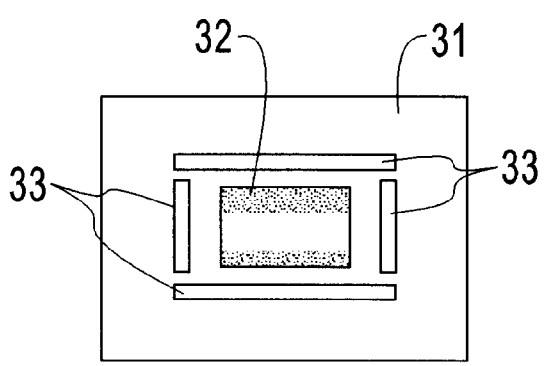
FIG. 3A is a schematic bottom-view of a first substrate with electrode structure and a spacer, according to the present invention.
Figure 3B:
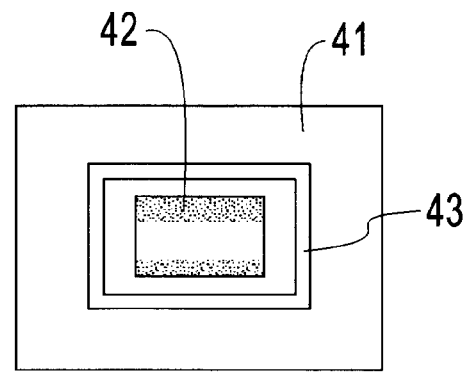
FIG. 3B is a schematic bottom-view of a first substrate with an electrode (referred to as electrode structure) and another spacer, according to the present invention.
Figure 3C:
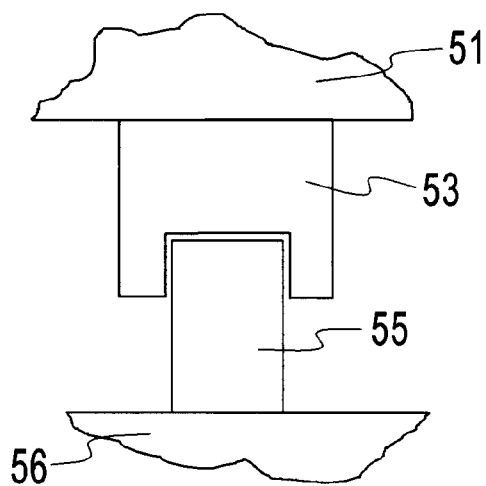
FIG. 3C is a schematic cross section of a first substrate and second substrate with female and male spacers, according to the present invention.

If silicon is used as first substrate, micro-mechanical techniques can be employed to define the spacers. Examples of complicated spacers are illustrated in FIGS. 3A–3C. A bottom-view of a first substrate 31 is given in FIG. 3A. The substrate 31 carries an electrode 32 and a set of spacers 33 arranged around the electrode 32. A bottom-view of a first substrate 41 is given in FIG. 3B. This substrate also carries an electrode 42 and a spacer 43. The spacer 43 forms a rectangular wall around the electrode 42. Instead of a rectangular wall, any kind of a wall like structure may serve as spacer. Well suited for example are honeycomb structures. If using micro-mechanical techniques there are almost no bounds to the shape and/or arrangement of spacers.

A cross-sectional view of two spacer halves 53 and 55 is shown in FIG. 3C. The upper spacer 53 is formed on the first substrate 51 which also carries an electrode (not shown). This upper spacer 53 is a so-called female spacer which has a bay to receive the corresponding counterpart spacer 55 (male spacer). The male spacer 55 is formed on the second substrate 56 on which the organic stack and an electrode is situated (not shown). This kind of an arrangement and equivalent kinds of spacer structures allow a precise alignment of the first and second substrates 51 and 56 if flipped together.

It is to be noted that the spacers can also be formed separately. One might for example form a first electrode on a first substrate and grow an organic stack on this electrode. Another electrode may be formed on a second substrate. In addition, a spacer mesh or web (e.g. a honeycomb structure) can be formed separately. Then the spacer mesh or web is placed on one of the two structures before they are joined together. Such a spacer mesh or web can be made using micro-mechanical techniques or molding techniques, for example.

In the simplest case the spacers consist of robust, non-conducting materials like silicon nitride, $SiN_x$, $SiO_x$, $SiO_2$, Siliconoxynitride (SiON), organic compounds such as polyimides, aluminiumoxide, aluminiumnitride, or titaniumoxide, for example. These materials can easily be deposited on the structures and patterned. The shape of the spacers depends on the actual task, for example for display application the fill factor is a crucial point. Thus the size of the spacers should not exceed 20% of the actual active area. The shape of the spacers can be adapted to the special application. For some applications a self-aligning geometry consisting of a male and a female spacer part is of advantage.

If necessary for adequate lateral conductivity, an additional layer or stack of layers could be deposited on top of the cathode 12 to improve the electron injection into the cathode. Note that the electrode structure might either carry a simple one-layer electrode, a compound metal electrode, or a multi-layer electrode. Even certain organic layers might be part of the electrode structure. The anode 17 might also be a simple one-layer electrode, a compound metal electrode, or a multi-layer electrode.

Usually, the organic stack comprises several layers. Please note that the layered structure of the organic stack is not shown in FIGS. 1A and 1B.

When referring to the 'first substrate', substrates are meant that are suited to carry an electrode. Silicon is an example for such a substrate. Silicon has the advantage that driving circuitry can be integrated such that complex driving schemes can be realized.

If light is to be emitted through the first substrate the following two conditions have to be met. First, the electrode carried by the first substrate has to be semitransparent or transparent. Second, the substrate has to be semitransparent or transparent, too.

When using the expression 'second substrate', any substrate is meant which is suited to carry an electrode 17 and at least organic layer suited for light emission (EML) 14. If light is to be emitted through the substrate 16, this substrate 16 as well as the electrode 17 have to be semitransparent or transparent.

It is to be noted that also both substrates might be transparent.

When using the expression 'electrode', any kind of a structure is referred to which is suited to inject carriers (electrons or holes) into an organic stack. The electrode structure may comprise some organic layers in addition to the mere electrode material. E.g., a transport layer may be formed on a metal electrode. The electrode structure may be optimized by plasma-, UV-, or ozone-treatments, heat and surface modifications, polishing and the like to achieve the best materials and the most stable electrodes.

Figure 2:
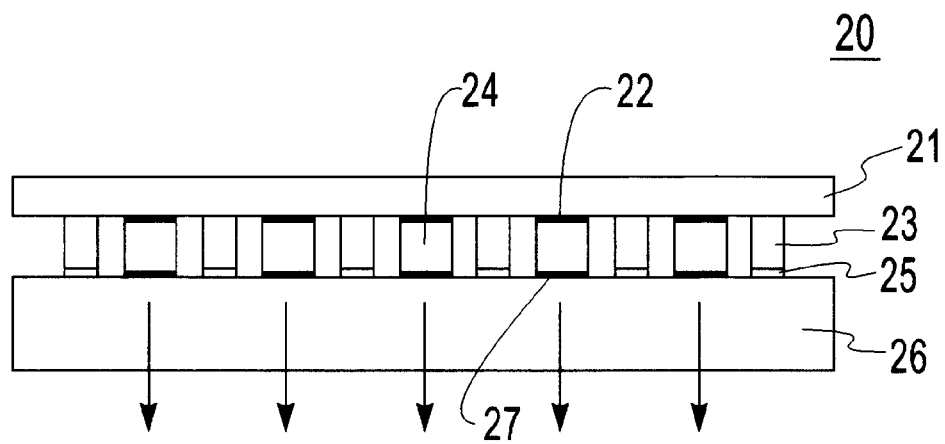
FIG. 2 is a schematic cross section of a flip-chip organic light emitting array, according to the present invention.

Another embodiment of the present invention is illustrated in FIG. 2. The shown device 20 is an anode-up array. From the glass substrate 26 up the array comprises a cathode 27 and an organic stack 24. To be more precise, the substrate 26 carries (listed in the order of deposition) ITO/TiN/ETL/EL/HTL. Please note that light is emitted from the active region within the organic stack 24 through the metal-compound cathode and ITO (together referred to as cathode 27) and substrate 26. Please note that in the present embodiment the organic stack 24 comprises an electron transport layer (ETL), an electroluminescent layer (EL), and a hole transport layer (HTL). In the following, exemplary details of the second embodiment are specified. In the present embodiment, the substrate 21 just carries the anode 22.

| Layer | No. | Material | Width | present example |
|---|---|---|---|---|
| substrate | 26 | glass | 0.05 mm–5 mm | 3 mm |
| outer cathode | 27 | ITO | 10–2000 nm | 20 nm |
| cathode | 27 | TiN | 10–100 nm | 40 nm |
| ETL and EL | 24 | Alq3 | 10–1000 nm | 80 nm |
| HTL | 24 | NPB | 5–500 nm | 50 nm |
| anode | 22 | Ni | 10–2000 nm | 50 nm |
| substrate | 21 | silicon | 0.1 mm–5 mm | 1 mm |

As mentioned, the silicon substrate 21 can be fabricated to contain active Si devices, such as for example an active matrix, drivers, memory and so forth. Such a silicon substrate 21 with integrated circuits can be used to realize inexpensive small area organic displays with high resolution and performance as well as large area displays, for example.

The substrate 21 carries spacers 23 and the substrate 26 carries spacers 25 which together define the distance between the upper flip-chip part and the lower flip-chip part when both parts of the device 20 are put together. The interface between the first (upper) flip-chip part and the second (lower) flip-chip part is stabilized by an appropriate interface formation process. In the present example this interface is an interface between the Ni anode 22 and the NPB hole transport layer 24.

On top of Si integrated circuits, stable electrodes can be formed. Well suited for example are ITO, Al, Cu, Au, Pt, Ni, and Cr. These electrodes 22 (which are part of the electrode structure) together with the opposite electrode 27 formed underneath the organic stack 24 are used to drive the organic stack 24 by applying a voltage. The cross-section of FIG. 2 shows five OLEDs arranged as an array. These OLEDs may be any color including blue or white.

Note that the electrode layer 27 can be a continuous layer such that several adjacent OLEDs share a common electrode. The electrode layer can consist of a combination of various cathode materials, for example containing ITO, TiN, low workfunction metals and alloys—as shown in the present example.

The organic stacks of the present devices may comprise:
at least one organic emission layers (EML), and
hole transport layer(s) (HTLs); and/or
electron transport layer(s) (ETLs); and/or
inorganic injection/barrier/confinement layers; and/or
buffer layers.

TiN and the other metals can be deposited by a variety of techniques, including vacuum evaporation, E-beam evaporation, reactive sputtering, glow discharges, and chemical vapor deposition (CVD). The higher temperature CVD processes can be used because the electrode structure is made separately from the sensitive organic stack. CVD is not suited for the fabrication of conventional OLEDs. Vacuum evaporation, E-beam evaporation, reactive sputtering, and glow discharges process are well suited for the formation of electrodes. No care has to be taken when forming the electrode structure about thermal stability and low glass transition temperatures of the organic materials, sputter damage and thermal stress in the layers of the organic stack.

Figure 4:
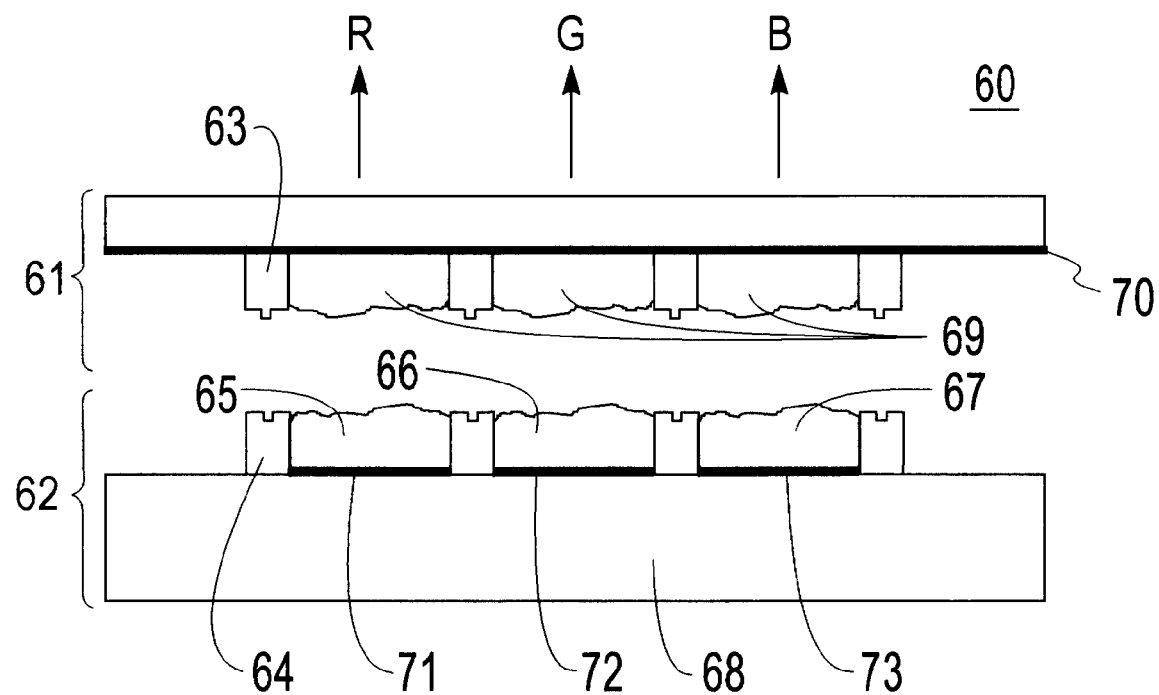
FIG. 4 is a schematic cross section of a flip-chip organic light emitting array, according to the present invention.

Yet another embodiment of the present invention is described in connection with FIG. 4. As shown in this figure, the organic opto-electronic device 60 (an organic R, G, B color display) comprises two halves 61 and 62. In the present embodiment, the upper half 61 carries male spacers 63 and the lower half 62 carries female spacers 64. It is one purpose of these spacers (like in the other embodiments) to define the distance between the two halves 61 and 62. It is another purpose of the spacers to form walls within the plane of the two halves that define the pixel size and shape. The reason why the spacers are designed to form walls is best understood when describing the method of making such the organic opto-electronic device 60.

As described in connection with the other embodiments, the individual halves of the organic color display 60 are fabricated separately, to allow optimization of the various processing steps. As shown in FIG. 4, the lower half 62 comprises silicon 68 with integrated circuitry (not shown) to drive the pixels. After the formation of the spacers, the pixels are filled with suitable materials 65–67 of different color (e.g. R, G, B). Due to the spacers serving as walls any intermixing of the different materials 65–67 (for example polymers) is avoided. In the present example, the pixels of the upper half 61 comprises polymers 69. To obtain a complete R, G, B display, the two halves 61 and 62 have to be aligned and put together. Optimum performance is achieved by a special interface formation procedure. Well suited in the present example is a heat treatment to facilitate the formation of a proper interface between the color pixels 65–67 and the polymer 69. The upper half 61 carries a common ITO electrode 70 whereas each pixel on the lower half 62 has an individual electrode 71–73 which allows to turn them on and off individually. These individual electrodes 71–73 are connected to the above-mentioned appropriate driving circuitry. If an appropriate voltage is applied to the pixels, then the pixel 65 emits red light, the pixel 66 emits green light, and the pixel 67 emits blue light. As described before, the spacers can provide conductive connections between circuitry on the two halves. This is especially important for large area displays where the conductivity of the common electrode limits the device performance.

An ink-jet technique can be used to fill the individual pixels. An ink-jet device has a droplet generator with nozzle from which ink droplets are emitted and directed to the respective pixel on the lower half 62. The ink-jet device or the lower half 62 may be transported at a relatively high speed so that one pixel after the other is filled with the appropriate color. Also the polymer 69 on the other half 61 can be filled using an ink-jet device.

The present invention allows the use of up to now not yet considered electrode materials. Well suited as electrode (cathode) material are metal-compounds with low workfunction. Metal-compound in the present context stands for any carbide, nitride, or boride of the early transition metals (such as group 4 and 5 transition metals) and lanthanides. One example of such a metal-compound is titanium nitride (TiN). These metal-compounds make up a whole new class of low-workfunction, semi-transparent, conducting materials very well suited as cathode for organic devices. Metal-compounds are described and claimed in a related international patent application WO99/31741, entitled "Compound-Metal Contacts for Organic Devices and Method for Making the Same." The international publication date of this patent application if Jun. 24, 1999.

Also well suited as electrode material is GaN and other non-degenerate, wide-bandgap semiconductors (nd-WBS). These nd-WBS electrode materials are addressed in the international patent application WO98/07202 with title "Gallium Nitride Based Cathodes for Organic Electroluminescent Devices and Displays". The international publication date of this patent application is Feb. 19, 1998. All nd-WBSs have the advantage that their wide bandgap makes them transparent.

Since both 'halves' of the organic light emitting devices are formed separately, even polymers can now be used in connection with evaporated small molecule systems, which was not conceivable so far because of the incompatibility of these two systems (for example polyaniline, polythiophene (derivatives) as hole injecting materials and PPV and PPV derivatives as emitting materials).

In the following some examples of the different organic materials which can be used are given.

Electron Transport/Emitting Materials $Alq_3$, $Gaq_3$, $Inq_3$, $Scq_3$, (q refers to 8-hydroxyquinolate or it's derivatives) and other 8-hydroxyquinoline metal complexes such as $Znq_2$, $Beq_2$, $Mgq_2$, $ZnMq_2$, $BeMq_2$, $BAlq$, and $AlPrq_3$, for example. These materials can be used as the ETL or emission layer.

Other classes of electron transporting materials are electron-deficient nitrogen-containing systems, for example oxadiazoles like PBD (and many derivatives), and triazoles, for example TAZ (1,2,4-triazole).

Finally, materials containing quinoline, quinoxaline, cinnoline, phthalazine and quinaziline functionalities are well known for their electron transport capabilities.

Other materials are didecyl sexithiophene (DPS6T), bis-triisopropylsilyl sexithiophene (2D6T), azomethin-zinc complexes, pyrazine (e.g. BNVP), styrylanthracene derivatives (e.g. BSA-1, BSA-2), non-planar distyrylarylene derivatives, for example DPVBi (see C. Hosokawa and T. Kusumoto, International Symposium on Inorganic and Organic Electroluminescence 1994, Hanamatsu, 42), cyano-substituted polymers such as cyano-PPV (PPV means poly (p-phenylenevinylene)) and cyano-PPV derivatives.

These functional groups can also be incorporated in polymers, starburst and spiro compounds. Further classes are materials containing pyridine, pyrimidine, pyrazine and pyridazine functionalities.

The following materials are particularly well suited as Emission Layers and Dopants Anthracene, pyridine derivatives (e.g. ATP), Azomethin-zinc complexes, pyrazine (e.g. BNVP), styrylanthracene derivatives (e.g. BSA-1, BSA-2), Coronene, Coumarin, DCM compounds (DCM1, DCM2), distyryl arylene derivatives (DSA), alkyl-substituted distyrylbenzene derivatives (DSB), benzimidazole derivatives (e.g. NBI), naphthostyrylamine derivatives (e.g. NSD), oxadiazole derivatives (e.g. OXD, OXD-1, OXD-7), N,N,N',N'-tetrakis(m-methylphenyl)-1,3-diaminobenzene (PDA), perylene and perylene derivatives, phenyl-substituted cyclopentadiene derivatives, 12-phthaloperinone sexithiophene (6T), polythiophenes, quinacridones (QA) (see T. Wakimoto et al., International Symposium on Inorganic and Organic Electroluminescence, 1994, Hamamatsu, 77), and substituted quinacridones (MQA), rubrene, DCJT (see for example: C. Tang, SID Conference San Diego; Proceedings, 1996, 181), conjugated and non-conjugated polymers, for example PPV and PPV derivatives, dialkoxy and dialkyl PPV derivatives, for example MEH-PPV (poly(2-methoxy)-5-(2'-ethylhexoxy)-1,4-phenylene-vinylene), poly(2,4-bis (cholestanoxyl)-1,4-phenylene-vinylene) (BCHA-PPV), and segmented PPVs (see for example: E. Staring in International Symposium on Inorganic and Organic Electroluminescence, 1994, Hamamatsu, 48, and T. Oshino et al. in Sumitomo Chemicals, 1995 monthly report).

Hole Transport Layers and Hole Injection Layers

The following materials are suited as hole injection layers and hole transport layers. Materials containing aromatic amino groups, like tetraphenyldiaminodiphenyl (TPD-1, TPD-2, or TAD) and NPB (see C. Tang, SID Meeting San Diego, 1996, and C. Adachi et al. Applied Physics Letters, Vol. 66, p. 2679, 1995), TPA, NIPC, TPM, DEH (for the abbreviations see for example: P. Borsenberger and D. S. Weiss, Organic Photoreceptors for Imaging Systems, Marcel Dekker, 1993). These aromatic amino groups can also be incorporated in polymers, starburst (for example: TCTA, m-MTDATA, see Y. Kuwabara et al., Advanced Materials, 6, p. 677, 1994, Y. Shirota et al., Applied Physics Letters, Vol. 65, p. 807, 1994) and spiro compounds.

Further examples are: Copper(II) phthalocyanine (CuPc), (N,N'-diphenyl-N,N'-bis-(4-phenylphenyl)-1,1'-biphenyl-4, 4'-diamine), distyryl arylene derivatives (DSA), naphthalene, naphthostyrylamine derivatives (e.g. NSD), quinacridone (QA), poly(3-methylthiophene) (P3MT) and its derivatives, perylene and perylene derivatives, polythiophene (PT), 3,4,9,10-perylenetetracarboxylic dianhydride (PTCDA), PPV and some PPV derivatives, for example MEH-PPV, poly(9-vinylcarbazole) (PVK), discotic liquid crystal materials (HPT).

There are many other organic materials known as being good light emitters, charge transport materials, and charge injection materials, and many more will be discovered. These materials can be used as well for making light emitting structures according to the present invention. More information on organic materials can be found in text books and other well known publications, such as the book "Inorganic and Organic Electroluminescence", edited by R. H. Mauch et al., Wissenschaft und Technik Verlag, Berlin, Germany, 1996, and the book "1996 SID International Symposium, Digest of Technical Papers", first edition, Vol. XXVII, May 1996, published by Society for Information Display, 1526 Brookhollow Dr., Suite 82, Santa Ana, Calif., USA.

Additionally, blend (i.e. guest-host) systems containing active groups in a polymeric binder are also possible. The concepts employed in the design of organic materials for OLED applications are to a large extent derived from the extensive existing experience in organic photoreceptors. A brief overview of some organic materials used in the fabrication of organic photoreceptors is found in the above mentioned publication of P. Brosenberger and D. S. Weiss, and in Teltech, Technology Dossier Service, Organic Electroluminescence (1995), as well as in the primary literature.

OLEDs have been demonstrated using polymeric, oligomeric and small organic molecules. The devices formed from each type of molecule are similar in function, although the deposition of the layers varies widely. The present invention is equally valid in all forms described above for organic light emitting devices based on polymers, oligomers, or small molecules, as well as starburst and spiro compounds.

Small molecule devices are routinely made by vacuum evaporation.

Evaporation can be performed in a Bell jar type chamber with independently controlled resistive and electron-beam heating of sources. It can also be performed in a molecular beam deposition system incorporating multiple effusion cells and sputter sources. Oligomeric and polymeric organics can also be deposited by evaporation of their monomeric components with later polymerization via heating or plasma excitation at the substrate. It is therefore possible to co-polymerize or create mixtures by co-evaporation.

In general, polymer containing devices (single layer, multilayer, polymer blend systems, etc.) are made by dissolving the polymer in a solvent and spreading it over the substrate either by spin coating or the doctor blade technique. With our novel method we are able to fabricate now well defined multilayer structures (i.e. with at least two layers) even with materials which dissolve only in the same solvent.

Additionally, hybrid devices containing both polymeric and evaporated small organic molecules are possible. In this case, the polymer film is generally deposited first, since evaporated small molecule layers often cannot withstand much solvent processing. According to the present invention, one is now much more flexible as far as the sequence of deposition is concerned.

More interesting is the possibility of making a polymer/inorganic transport layer on top of which monomeric layers are evaporated, possibly also incorporating alloys. If the polymer is handled in an inert atmosphere prior to introduction to vacuum, sufficient cleanliness for device fabrication is maintained.

What is claimed is:

1. An organic opto-electronic device comprising:
   a first flip-chip part with a first electrode of thickness D1 formed on a first substrate;
   a second flip-chip part with a second electrode formed on a second substrate and carrying an organic stack, the thickness of the second electrode and the organic stack being D2; and
   non-conductive spacers of thickness D, with $D=k(D1+D2)$ and $0.5 \leq k < 1$;
   wherein the first flip-chip part and the second flip-chip part are flipped together such that the organic stack is sandwiched between the first electrode and the second electrode, a minimum distance D is kept between the two substrates by the spacers, and a stabilized interface is formed between the first flip-chip part and the second flip-chip part.

2. The organic opto-electronic device of claim 1, wherein the parameter k is not less than 0.9 and not greater than 0.98.

3. The organic opto-electronic device of claim 1, wherein the first and second substrates comprise different materials.

4. The organic opto-electronic device of claim 1, wherein the spacers are integrated on one of the two substrates.

5. The organic opto-electronic device of claim 1, wherein part of the spacers are integrated on the first substrate and corresponding parts are integrated on the second substrate.

6. The organic opto-electronic device of claim 1, wherein the first substrate is semitransparent or transparent.

7. The organic opto-electronic device of claim 1, wherein the second substrate is semitransparent or transparent.

8. The organic opto-electronic device of claim 1, wherein the first electrode comprises a metal.

9. The organic opto-electronic device of claim 8, wherein the metal is a low-workfunction elemental metal or a low-workfunction alloy.

10. The organic opto-electronic device of claim 8, wherein the metal is a metal selected from a group consisting of Mg, Ca, Li, Al, Mg/Ag, Al/Li, and any combination thereof.

11. The organic opto-electronic device of claim 1, wherein the first electrode comprises more than one layer.

12. The organic opto-electronic device of claim 1, wherein the organic stack comprises an electroluminescent layer in which light is generated if a voltage is applied between the first electrode and the second electrode.

13. The organic opto-electronic device of claim 12, wherein the first electrode comprises a metal-compound electrode.

14. The organic opto-electronic device of claim 12, wherein the first electrode comprises a non-degenerate, wide-bandgap semiconductor.

15. The organic opto-electronic device of claim 12, wherein the organic stack comprises from the second substrate up the second electrode, a first charge transport layer, and the electroluminsecent layer.

16. The organic opto-electronic device of claim 12, wherein the organic stack further comprises a second charge transport layer on the electroluminsecent layer.

17. The organic opto-electronic device of claim 12, wherein the first electrode or the second electrode comprises ITO or high workfunction metals.

18. The organic opto-electronic device of claim 1, wherein the spacers comprises silicon nitride, or $SiN_x$, or $SiO_x$, or $SiO_2$, or Siliconoxynitride (SiON), or organic compounds, or aluminiumoxide, or aluminiumnitride, or titaniumoxide.

19. The organic opto-electronic device of claim 1, wherein the spacers are formed separately from the two substrates and placed between these two substrates when flipping them together.

20. The organic opto-electronic device of claim 19, wherein a mesh of thickness D serves as spacers.

21. The organic opto-electronic device of claim 1, wherein the first substrate comprises at least one of the group of an active and a passive device.

22. The organic opto-electronic device of claim 1, comprising several organic light emitting devices each having an organic stack and a corresponding first electrode.

23. The organic opto-electronic device of claim 1, wherein the stabilized interface is an interface within the organic stack which is uniform, or homogeneous, or interlinked.

24. A display having an organic light emitting device and means for driving the organic light emitting device, the organic light emitting device comprising a first flip-chip part with a first electrode of thickness D1 formed on a first substance, and a second flip-chip part with a second electrode formed on a second substrate and carrying an organic stack, the thickness of the second electrode and the organic stack being D2 and the organic stack including an electroluminescent layer (EL) in which light is generated if a voltage is applied between the first electrode and the second electrode, the organic light emitting device further including non-conductive spacers of thickness D, with $D=k(D1+D2)$ and $0.5 \leq k < 1$, the first flip-chip part and the second flip-chip part being flipped together such that the organic stack is sandwiched between the first electrode and the second electrode, a minimum distance D being kept between the two substrates by the spacers, a stabilized interface being formed between the first flip-chip part and the second flip-chip part, and the driving means comprising means for applying the voltage between the first electrode and the second electrode.

* * * * *